(12) United States Patent
Hsieh

(10) Patent No.: US 6,245,614 B1
(45) Date of Patent: Jun. 12, 2001

(54) METHOD OF MANUFACTURING A SPLIT-GATE FLASH MEMORY CELL WITH POLYSILICON SPACERS

(75) Inventor: Tsong-Minn Hsieh, Miao-Li (TW)

(73) Assignee: United Microelectronics Corp., Hsin-chu (TW)

( * ) Notice: Subject to any disclaimer, the term of this patent is extended or adjusted under 35 U.S.C. 154(b) by 0 days.

(21) Appl. No.: 09/597,745

(22) Filed: Jun. 19, 2000

(51) Int. Cl.⁷ .............................................. H01L 21/8247
(52) U.S. Cl. ........................................ 438/267; 438/596
(58) Field of Search .................................... 438/257, 258, 438/264, 266, 267, 596

(56) References Cited

U.S. PATENT DOCUMENTS

| 5,364,806 | * | 11/1994 | Ma et al. | 438/266 |
| 5,494,838 | * | 2/1996 | Chang et al. | 438/267 |
| 5,652,161 | * | 7/1997 | Ahn | 438/267 |
| 5,953,611 | * | 9/1999 | Tanaka | 438/596 |

FOREIGN PATENT DOCUMENTS

10022404 * 1/1998 (JP) .

* cited by examiner

Primary Examiner—Chandra Chaudhari
(74) Attorney, Agent, or Firm—Winston Hsu

(57) ABSTRACT

A method of manufacturing a self-aligned split-gate flash memory cell with high coupling ratio is disclosed. A polysilicon spacer is first formed on each of the inner walls between the two select gates on which a dielectric layer is formed. A drain and a source are next formed adjacent to each of the outer walls of the two select gates and between the two polysilicon spacers, respectively. A silicon oxide layer is deposited. A predetermined thickness of the silicon oxide layer is then removed and the dielectric layer is removed down to a predetermined thickness by using a dry etching process. Finally, a control gate is formed above the polysilicon spacers.

15 Claims, 9 Drawing Sheets

METHOD OF MANUFACTURING A SPLIT-GATE FLASH MEMORY CELL WITH POLYSILICON SPACERS

BACKGROUND OF THE INVENTION

1. Field of the Invention

The present invention relates to a method of manufacturing a split-gate flash memory cell. More particularly, the invention relates to a method of manufacturing a self-aligned split-gate flash memory cell with an improved coupling ratio.

2. Description of the Prior Art

EEPROM (electrically erasable programmable read only memory) is a very popular memory device used in the electronics industry because it can store data in a non-volatile manner for more than 10 years, and it can be reprogrammed or erased many times. But one weakness of EEPROM devices is that their memory access time is quite slow compared to other memory devices. In order to solve this problem, a flash EEPROM device was developed by Intel. In contrast to traditional EEPROM, the flash EEPROM can erase recorded data a block at a time instead of a byte at a time, and thus dramatically increases the memory access time.

The flash memory technology achieves high density due to a smaller memory cell size realized in a stacked-gate memory cell profile. A stacked-gate flash memory cell comprises a floating gate for storing electric charge, a control gate for controlling the charging of the floating gate, and a dielectric layer positioned between the floating gate and the control gate. Like a capacitor, the flash memory stores electric charge in the floating gate to represent a digital data bit of "1", and removes charge from the floating gate to represent a digital data bit of "0".

Please refer to FIG. 1. FIG. 1 is a cross-sectional diagram of a conventional stacked-gate flash memory cell 10. As shown in FIG. 1, the stacked-gate flash memory cell 10 comprises a stacked-gate 11, a drain 22 and a source 24. The drain 22 and the source 24 define the channel length in the silicon substrate 20 under the stacked-gate 11. The stacked-gate 11 comprises a gate oxide layer 12, a floating gate 14 stacked on the gate oxide layer 12, an insulating layer 16 stacked on the floating gate 14, and a control gate 18 stacked on the insulating layer 16. By virtue of tunneling effects, hot electrons are injected into the floating gate 14 from the drain 22 through the gate oxide layer 12 so as to change the threshold voltage of the floating gate 14 and thus enable the storage of data. Although the stacked-gate flash memory cell 10 enhances integration, it is, however, prone to over-erasing.

Please refer to FIG. 2. FIG. 2 is a cross-sectional diagram of a conventional split-gate flash memory cell 30. As shown in FIG. 2, the split-gate flash memory cell 30 comprises a gate oxide layer 32, a floating gate 34, a control gate 38, a drain 42 and a source 44. Similarly, the floating gate 34 and control gate 38 are separated by an insulating layer 36. Portions of the control gate 38 overlay the floating gate 34, and the remaining portions of the control gate 38 directly overlay the channel 31. The split-gate flash memory cell 30 is superior to the stacked-gate flash memory cell 10 in terms of cell reliability, yet occurrences of unstable channel current due to variations of the stepper system are often observed. This unstable channel current results from misalignment of the overlapping area between the control gate 38 and floating gate 34. Furthermore, the coupling ratio of the conventional split-gate flash memory cell is insufficient, leading to a reduced erasing rate and inferior product endurance.

Please refer to FIG. 3. FIG. 3 illustrates an equivalent circuit 46 of the conventional split-gate flash memory cell 30 depicted in FIG. 2. As shown in FIG. 3, $C_1$ is the capacitance between the floating gate 34 and the control gate 38, $C_2$ is the capacitance between the floating gate 34 and the source 44, $C_3$ is the capacitance between the floating gate 34 and the silicon substrate 40, and $C_4$ is the capacitance between the floating gate 34 and the drain 42. The coupling ratio (CR value) of the split-gate flash memory cell 30 is defined as:

$$CR=C_1/(C_1+C_2+C_3+C_4)$$

CR value is an index that is usually used to evaluate the performance of a split-gate flash memory cell. The higher the coupling ratio, the better the performance of the flash memory cell. According to the above equation, one approach to increase the CR value is to increase the capacitive surface between the floating gate 34 and the control gate 38, as this surface is proportional to the capacitance $C_1$. On the other hand, increasing the CR value can also be achieved by decreasing the capacitive surface between the floating gate 34 and the silicon substrate 40, as this surface is proportional to $C_3$.

Please refer to FIG. 4 to FIG. 7. FIG. 4 to FIG. 7 are cross-sectional diagrams of forming a split-gate flash memory cell 80 on a semiconductor wafer 50 according to the prior art method. As shown in FIG. 4, the semiconductor wafer 50 comprises a silicon substrate 52 and a silicon oxide layer 54 positioned on the silicon substrate 52.

As shown in FIG. 5, a patterned photo-resist layer 56 is first formed on the surface of the silicon oxide layer 54. An ion implantation process is then performed to form two doped regions on the surface of the silicon substrate 52. The photo-resist layer 16 serves as a hard mask during the ion implantation process. A rapid thermal processing (RTP) is used to drive the dopants into the silicon substrate 52 so as to form two diffused regions 62, which serve as a source and a drain of the split-gate flash memory cell 80.

As shown in FIG. 6, the photo-resist layer 56 is completely removed and a low-pressure chemical vapor deposition (LPCVD) process is performed to form a polysilicon layer (not shown). A patterned photo-resist layer 66 is formed on the surface of the polysilicon layer. An anisotropic etching process is then performed using the photo-resist layer 66 as a hard mask to vertically remove the polysilicon layer down to the surface of the silicon oxide layer 54 so as to form a floating gate 64.

Finally, as shown in FIG. 7, the photo-resist layer 66 is removed and an LPCVD process is performed to form a silicon oxide layer 68 on the surface of the semiconductor wafer 50. The silicon oxide layer 68 serves as a tunnel oxide layer of the split-gate flash memory cell 80. Another LPCVD process is then performed to form a polysilicon layer (not shown) on the surface of the silicon oxide layer 68 and a patterned photo-resist layer is formed on the polysilicon layer. An anisotropic etching process is then performed using the photo-resist layer as a hard mask to vertically remove the polysilicon layer down to the surface of the silicon oxide layer 68 so as to form the control gate 70.

SUMMARY OF THE INVENTION

It is a primary objective of the present invention to provide a method of fabricating a self-aligned split-gate flash memory cell with a superior coupling ratio, and to provide a manufacturing process that can effectively enhance the performance of split-gate flash memory products.

In accordance with the objective of the invention a new method of fabricating a high coupling ratio split-gate flash memory cell is disclosed. A semiconductor wafer is first provided having a substrate, at least two select gates formed on the substrate, and a dielectric layer formed on each select gate. A polysilicon spacer acting as a floating gate is formed on each of the inner walls between the two select gates. A drain is formed in the substrate adjacent to each of the outer walls of the two select gates. A source is formed in the substrate between the two polysilicon spacers by using a self-aligned ion implantation process. A silicon oxide layer is provided on the surface of the semiconductor wafer to cover the dielectric layer, the select gates and the polysilicon spacers. A dry etching process is used to remove a predetermined thickness of the silicon oxide layer and to remove the dielectric layer above each of the select gates down to a predetermined thickness, thereby exposing portions of the polysilicon spacers. An ONO insulating layer is formed on the exposed portions of the polysilicon spacers. A control gate is formed above the two polysilicon spacers to complete the fabrication of the high coupling ratio split-gate flash memory cell.

According to the present invention, two polysilicon spacers acting as floating gates are formed on the inner walls between the two select gates. The two polysilicon spacers are formed using an anisotropic dry etching process so that the problem of misalignment is completely avoided. A dry etching process is then used to remove a predetermined thickness of the silicon oxide layer and to remove the dielectric layer above each of the select gates down to a predetermined thickness. Consequently, a significant increase in the capacitive surface between the floating gate and the control gate is achieved, thus enhancing the coupling ratio of the split-gate flash memory cell.

DETAILED DESCRIPTION OF THE PREFERRED EMBODIMENT

Figure 1:
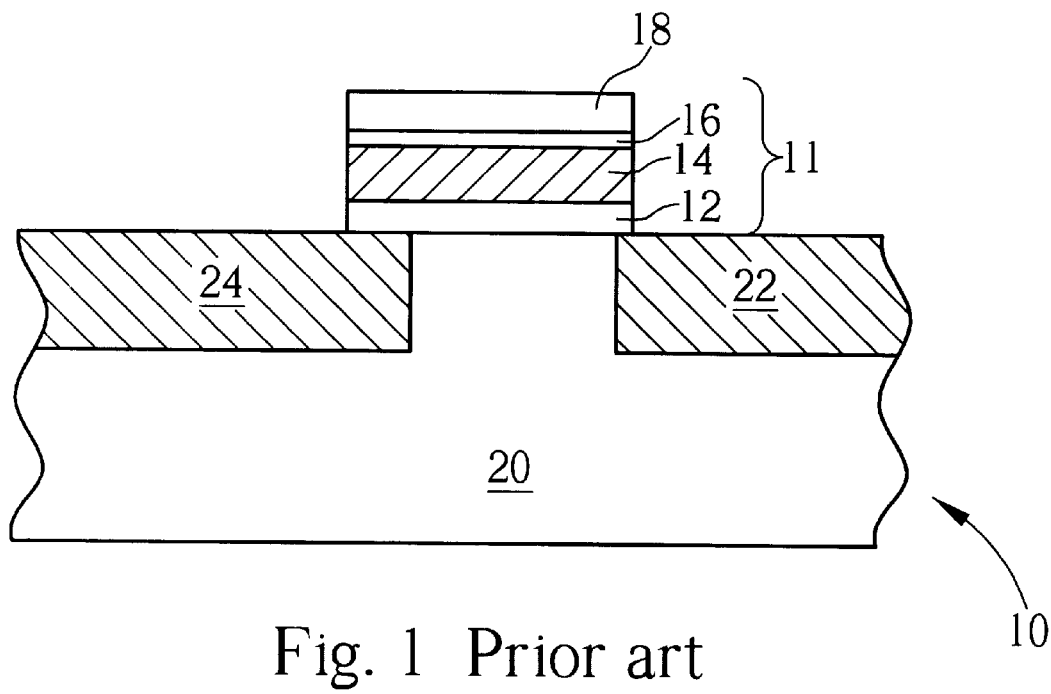
FIG. 1 is a cross-sectional diagram of a stacked-gate flash memory cell according to the prior art.
Figure 2:
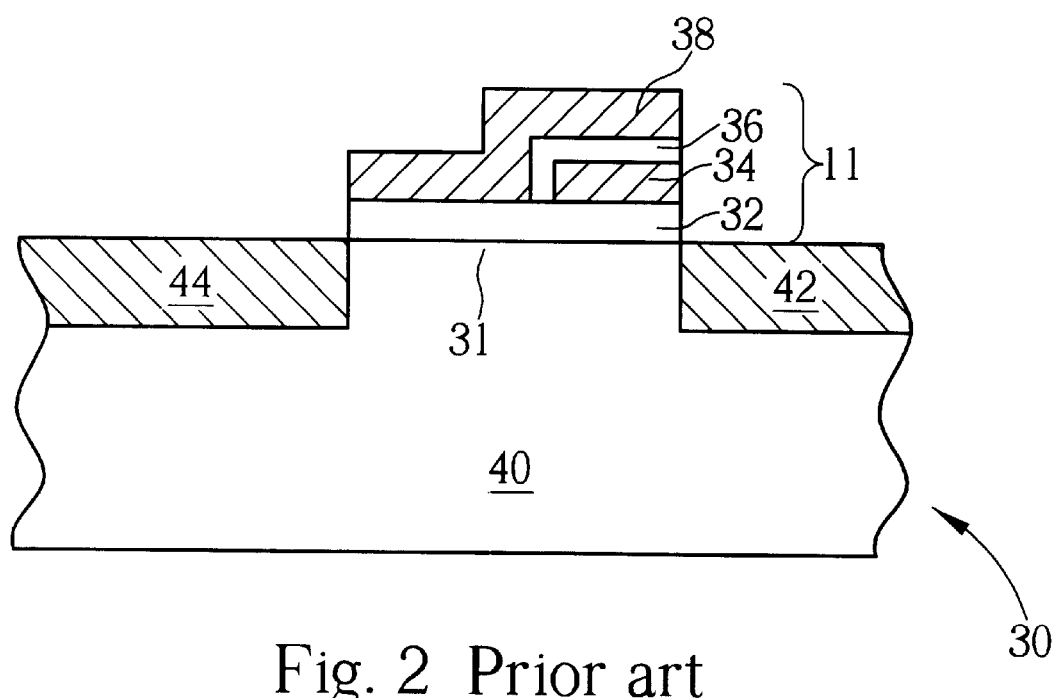
FIG. 2 is a cross-sectional diagram of a split-gate flash memory cell according to the prior art.
Figure 3:
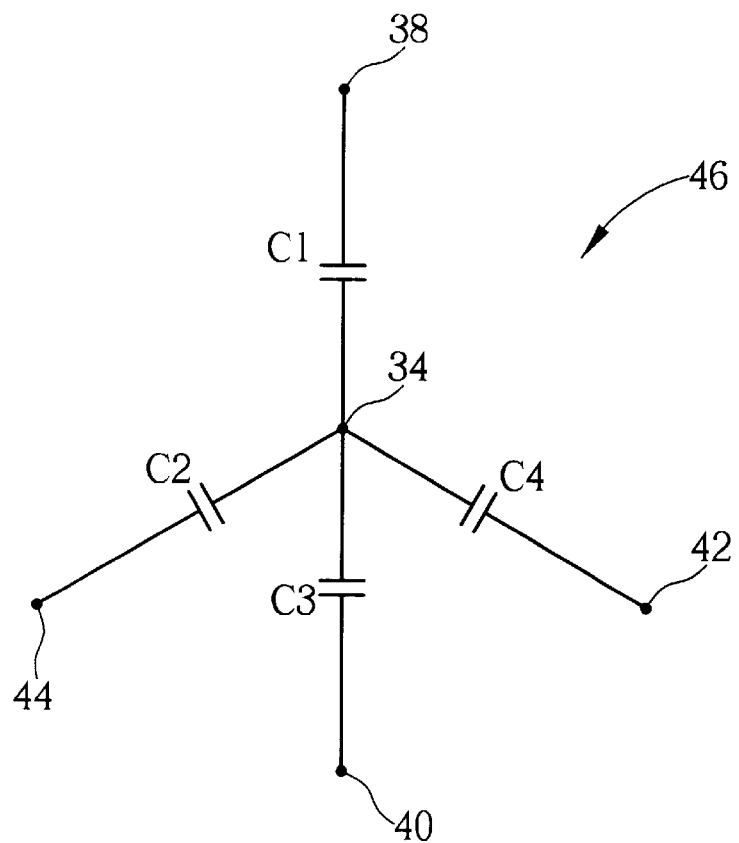
FIG. 3 is an equivalent circuit of the conventional split-gate flash memory cell depicted in FIG. 2.
Figure 4:
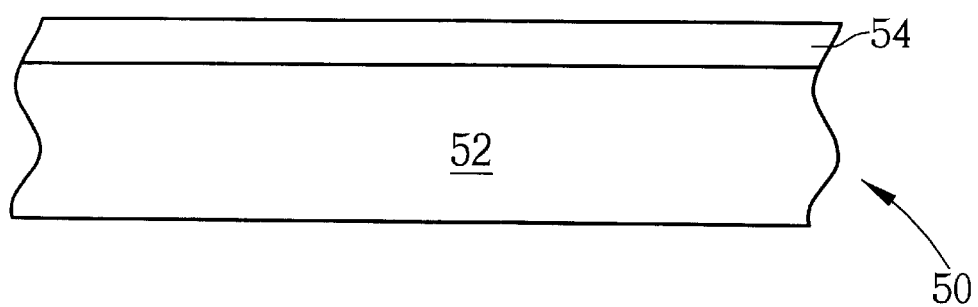
FIG. 4 to FIG. 7 are cross-sectional diagrams of forming a split-gate flash memory cell on a semiconductor wafer according to the prior art.
Figure 5:
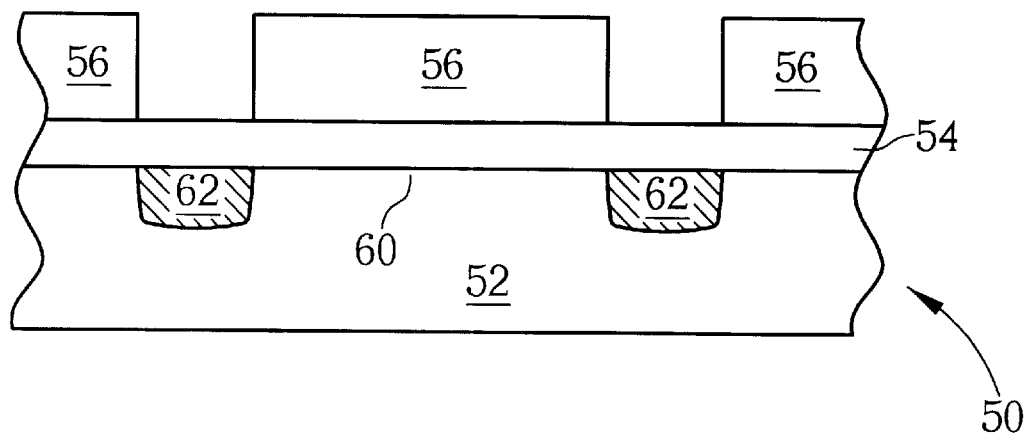
Figure 6:
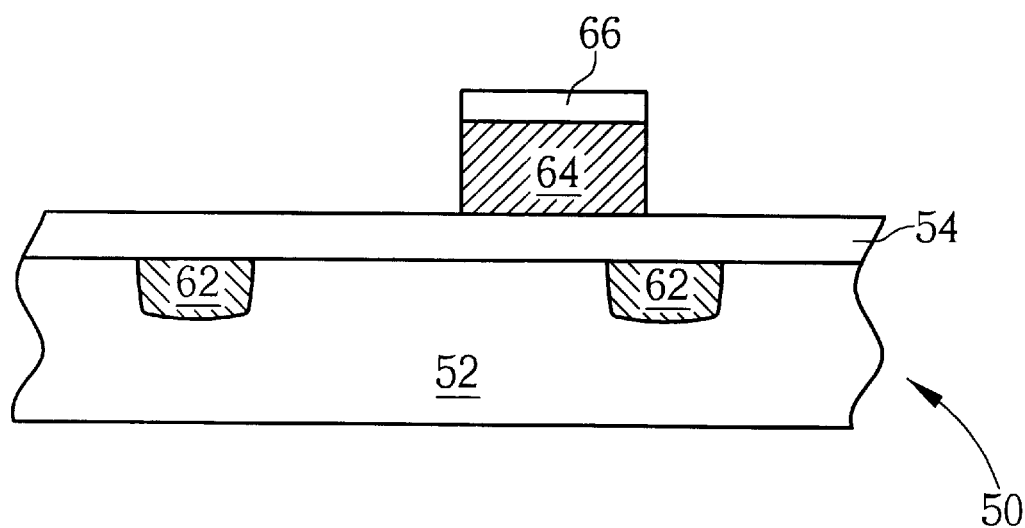
Figure 7:
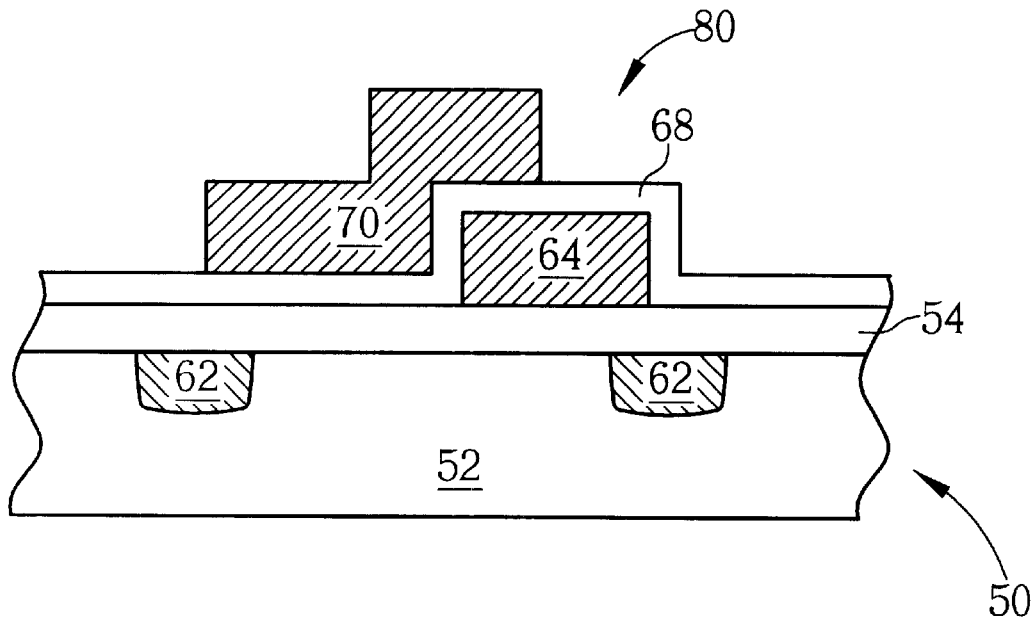
Figure 8:
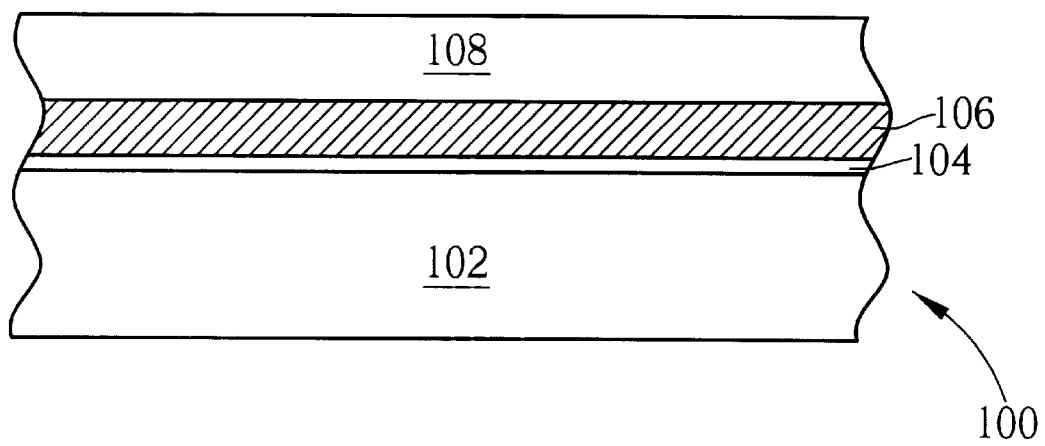
FIG. 8 to FIG. 17 are cross-sectional diagrams of forming a split-gate flash memory cell on a semiconductor wafer according to the present invention.

Please refer to FIG. 8 to FIG. 17. FIG. 8 to FIG. 17 are cross-sectional diagrams of forming a split-gate flash memory cell 150 on a semiconductor wafer 100 according to the present invention. As shown in FIG. 8, the semiconductor wafer 100 comprises a silicon substrate 102, a gate oxide layer 104 grown on the surface of the silicon substrate 102, a polysilicon layer 106 formed over the gate oxide layer 104, and a dielectric layer 108 that is composed of silicon dioxide formed over the polysilicon layer 106. The thickness of the dielectric layer 108 is between 4000 to 5000 angstroms.

Figure 9:
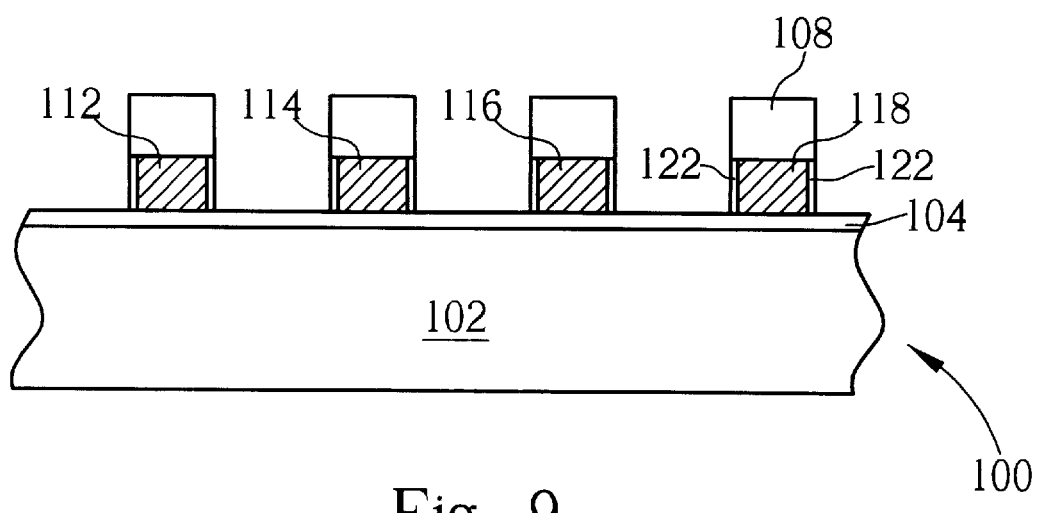

As shown in FIG. 9, a lithographic process and an anisotropic etching process are performed to vertically etch the dielectric layer 108 and the polysilicon layer 106 down to the surface of the gate oxide layer 104 so as to form select gates 112, 114, 116 and 118. A thermal oxidation process is then performed to form a silicon dioxide layer 122 with a thickness of about 150 to 200 angstroms on the exposed surface of the select gates.

Figure 10:
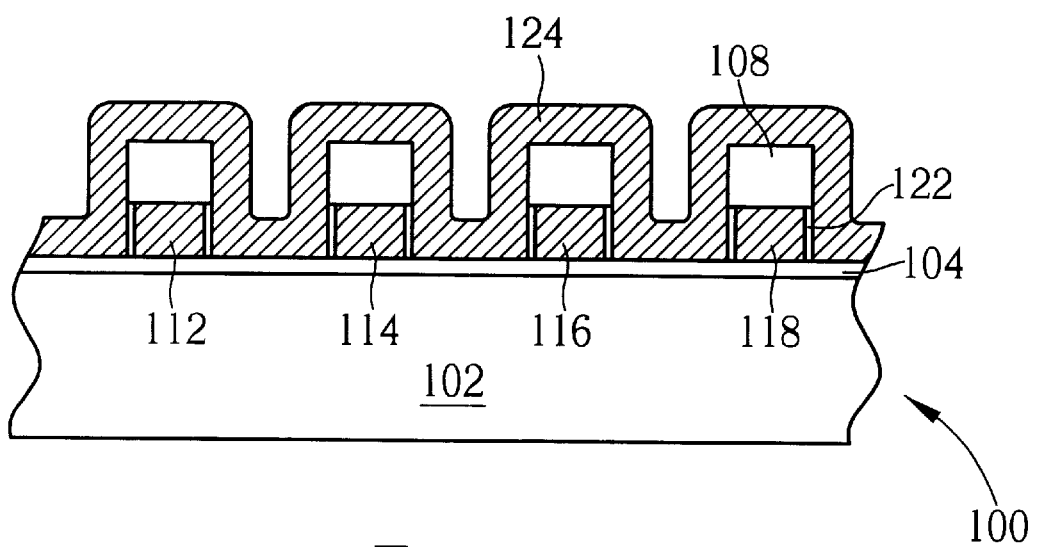

As shown in FIG. 10, a chemical vapor deposition (CVD) process is performed to form a polysilicon layer 124 with a thickness of 2500 to 4000 angstroms on the surface of the semiconductor wafer 100 covering the silicon substrate 102, the select gates 112, 114, 116, 118 and the dielectric layer 108. An etch back process is performed next to remove the polysilicon layer 124 down to the surface of the silicon substrate 102. The remaining portions of the polysilicon layer 124 on the walls of each select gate forms polysilicon spacers 126.

Figure 11:
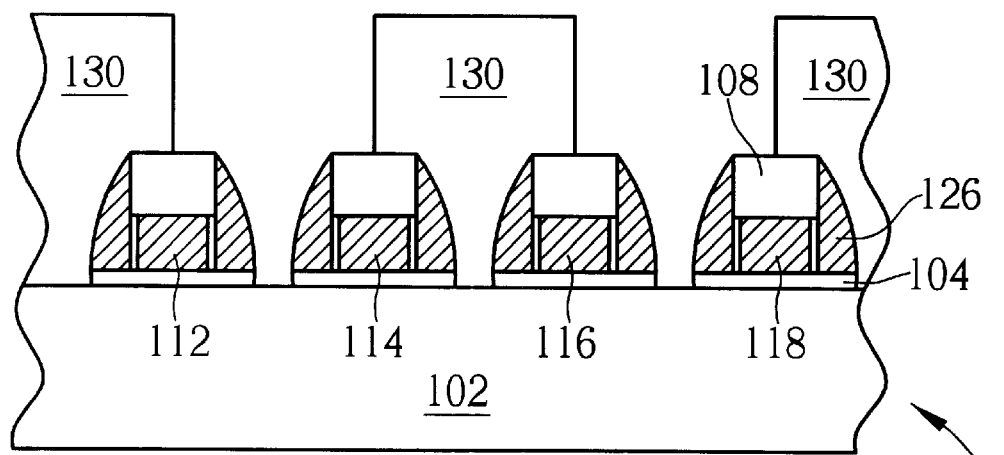
Figure 12:
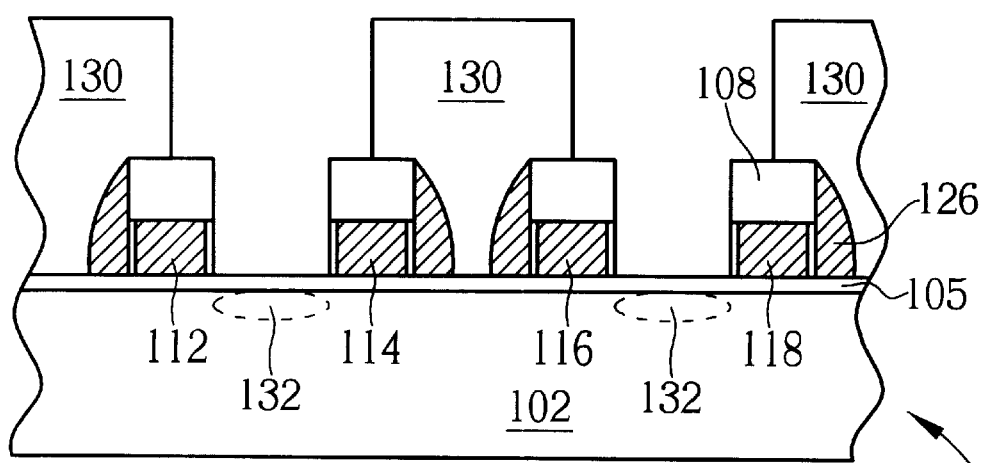

As shown in FIG. 11, a patterned photo-resist layer 130 acting as a hard mask in a subsequent etching and ion implantation processes is formed over the polysilicon spacers 126 between the select gates 114 and 116. In FIG. 12, an anisotropic dry etching process is performed to remove the polysilicon spacers 126 between the select gate 112 and select gate 114 and between the select gate 116 and select gate 118, which are not covered by the photo-resist layer 130. An ion implantation process is then performed to form a drain doping region in the silicon substrate 102 between the select gate 112 and select gate 114 and between the select gate 116 and select gate 118. The photo-resist layer 130 is then completely removed using a series of photo-resist stripping and wet cleaning processes.

Figure 13:
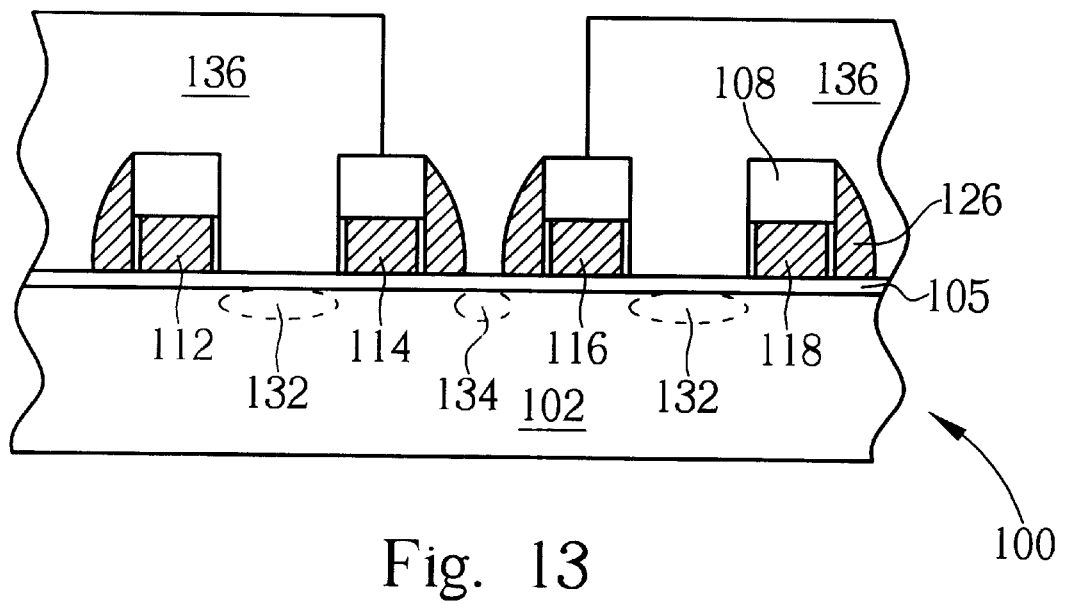

After removing the photo-resist layer 130, a new photo-resist layer 136 is spin-coated onto the surface of the semiconductor wafer 100. As shown in FIG. 13, a conventional lithographic process is performed on the surface of the photo-resist layer 136 to expose the surface of the silicon substrate 102 between the select gates 114 and 116. A self-aligned ion implantation process is then performed using the polysilicon spacers between the select gates 114 and 116 as hard masks to form a source doping region on the exposed surface of the silicon substrate 102. The photo-resist layer 136 is then removed.

Figure 14:
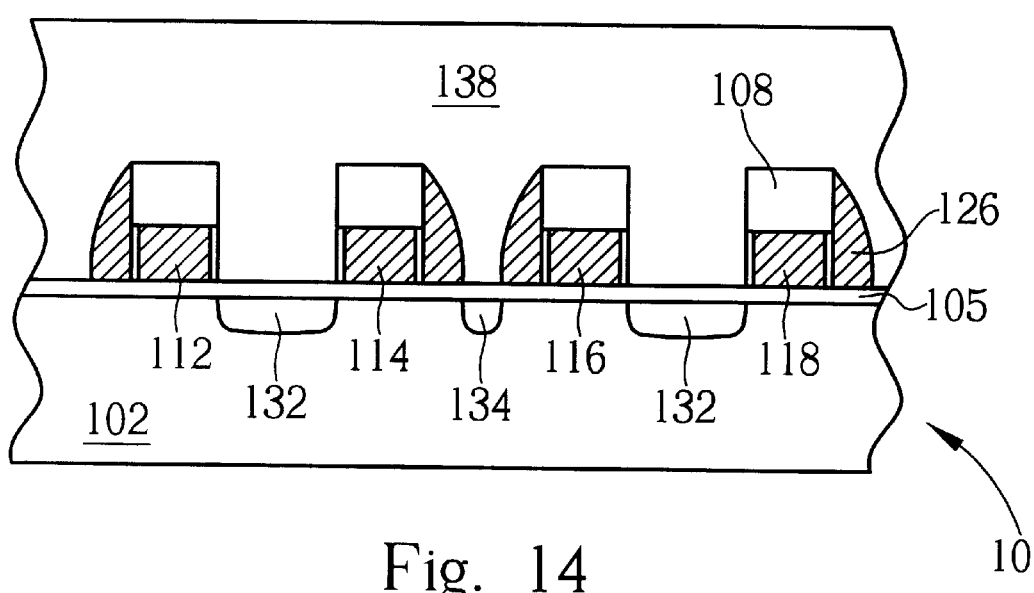

After removing the photo-resist layer 136, as shown in FIG. 14, a rapid thermal process (RTP) is performed at a temperature of about 1000 to 1100° C. to drive the dopants in the source doping region and drain doping region into the silicon substrate 102 so as to form a source 134 and a drain 132. A CVD process is performed to deposit a silicon oxide layer 138 with a thickness of about 1.5 to 2 m on the surface of the semiconductor wafer 100 and cover the dielectric layer 108, the select gates 112, 114, 116, 118 and the polysilicon spacers 126.

Figure 15:
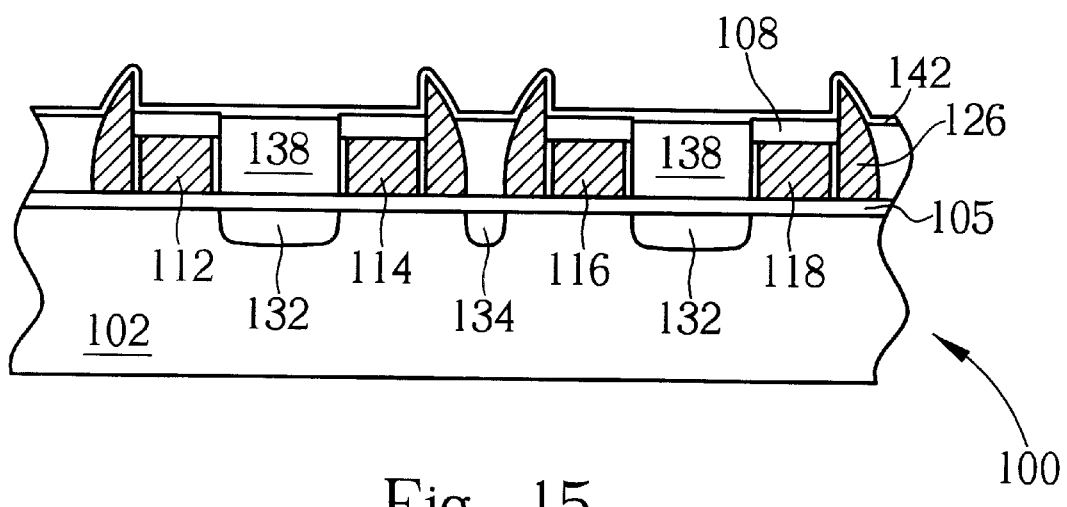

As shown in FIG. 15, a dry etching process is performed to remove a thickness of about 1.7 to 2.2 m from the silicon oxide layer 138, and to remove the dielectric layer 108 above each of the select gates down to a thickness of about 500 to 800 angstroms. An insulating layer 142 is then formed over the silicon oxide layer 138, the dielectric layer 108 and the exposed surface of each of the polysilicon spacers 126.

The insulating layer 142 is an ONO (oxidized-silicon nitride-silicon oxide) dielectric layer with a thickness of 95 to 175 angstroms. A native oxide layer (not shown) is first formed on the surface of the polysilicon spacer 126 with a thickness of 10 to 50 angstroms. A plasma-enhanced CVD process, or an LPCVD process, is then performed to form a silicon nitride layer (not shown) with a thickness of about 45 angstroms. Finally, a healing process is performed in an oxygen-containing atmosphere at about 800° C. for approximately 30 minutes to form a silicon oxy-nitride layer with a thickness of 40 to 82 angstroms over the silicon nitride layer. The native oxide, the silicon nitride layer and the silicon oxy-nitride layer form the insulating layer 142.

Figure 16:
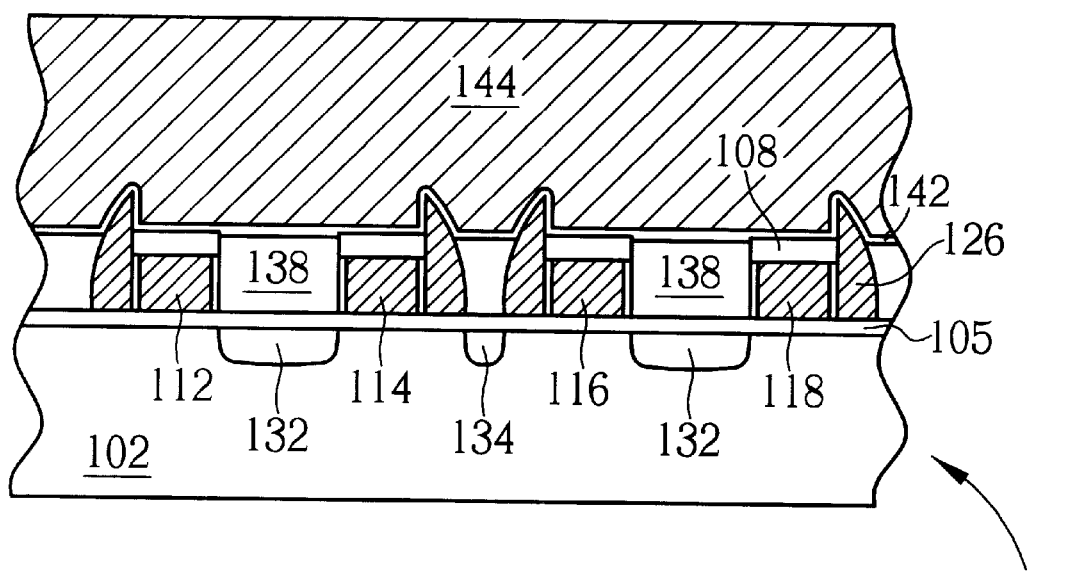
Figure 17:
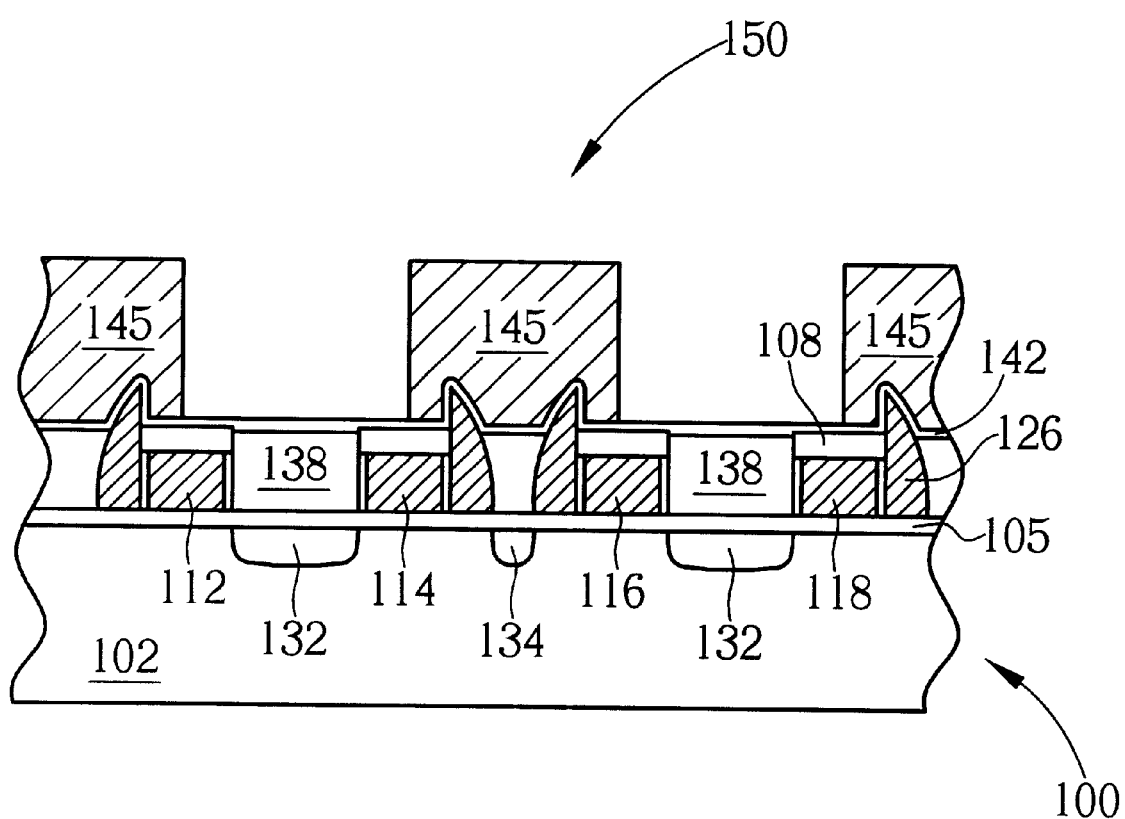

As shown in FIG. 16, a polysilicon layer 144 with a thickness of 3000 to 3500 angstroms is deposited on the surface of the semiconductor wafer 100 by a CVD process. As shown in FIG. 17, a control gate 145 is formed above the polysilicon spacers 126 between the select gate 114 and select gate 116 by performing a conventional lithographic process and a dry etching process on the polysilicon layer 144 so as to complete the flash memory cell 150.

In contrast to the prior art, the self-aligned polysilicon spacer 126 formed using a dry etching process is used as a floating gate in the method of manufacturing a split-gate flash memory cell 150 according to the present invention. The capacitive surface between the floating gate and silicon substrate 102 is thus significantly reduced, thereby increasing the coupling ratio (CR value) of the flash memory cell 150. According to the present invention, a silicon oxide layer 138 is deposited on the surface of the semiconductor wafer 100. An anisotropic dry etching process is subsequently used to remove a predetermined thickness of the silicon oxide layer 138 and to remove the dielectric layer 108 above each of the select gates down to a predetermined thickness so as to expose a portion of the polysilicon spacer 126. The exposed surface of the polysilicon spacer 126 increases the capacitive surface between the polysilicon spacer 126 and the control gate 145 and enhances the CR value.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of manufacturing a self-aligned split-gate flash memory cell on a semiconductor wafer, the semiconductor wafer comprising a substrate, at least two select gates formed on the substrate, and a dielectric layer formed on each of the select gates, the method comprising:

forming a polysilicon spacer on each of the inner walls between the two select gates;

forming a drain in the substrate adjacent to each of the outer walls of the two select gates;

forming a source in the substrate between the two polysilicon spacers;

forming a silicon oxide layer on the surface of the semiconductor wafer to cover the dielectric layers, select gates and polysilicon spacers;

performing a dry etching process to remove a predetermined thickness of the silicon oxide layer and to remove the dielectric layer above each of the select gates down to a predetermined thickness;

forming an insulating layer over each of the polysilicon spacers; and forming a control gate above the two polysilicon spacers;

wherein each of the two polysilicon spacers acts as a floating gate of the spilt-gate flash memory cell and is used to enhance the coupling ratio of the spilt-gate flash memory cell.

2. The method of claim 1 wherein each of the select gates is formed from a gate oxide layer, a first polysilicon layer stacked on the gate oxide layer, and a silicon dioxide layer installed on the surrounding wall of the first polysilicon layer.

3. The method of claim 1 wherein the substrate is a silicon substrate and the dielectric layer is composed of silicon dioxide.

4. The method of claim 1 wherein the method of forming the two polysilicon spacers on the inner walls of the two select gates comprises the following steps:

forming a second polysilicon layer on the surface of the semiconductor wafer to cover the substrate, the two select gates and the two dielectric layers above the two select gates;

performing an etch back process to remove the second polysilicon layer down to the surface of the substrate, the remaining portions of the second polysilicon layer on the walls of the two select gates forming two polysilicon spacers;

forming a first photo-resist layer above the inner walls of the two select gates; and performing an etching process to remove the polysilicon spacers that are not covered by the first photo-resist layer.

5. The method of claim 4 wherein after the etching process the method further comprises the following steps to form the drain and the source:

performing a first ion implantation process to form a drain doping region in the substrate adjacent to the outer wall of each of the two select gates;

removing the first photo-resist layer;

forming a second photo-resist layer on the semiconductor wafer to expose the surface of the substrate between the two polysilicon spacers;

performing a second ion implantation process to form a source doping region in the substrate between the two polysilicon spacers;

removing the second photo-resist layer; and performing an annealing process.

6. The method of claim 1 wherein the insulating layer over each of the polysilicon spacers is an oxidized-silicon nitride-silicon oxide (ONO) dielectric layer.

7. The method of claim 1 wherein the control gate is composed of doped polysilicon.

8. A method of manufacturing a split-gate flash memory cell with high coupling ratio on a semiconductor wafer, the semiconductor wafer comprising a silicon substrate, the method comprising:

forming serially a gate oxide layer, a first polysilicon layer and a dielectric layer on the surface of the silicon substrate;

performing a lithographic process and a dry etching process to remove portions of the dielectric layer and the first polysilicon layer down to the gate oxide layer so as to form a first select gate, second select gate and third select gate;

forming a polysilicon spacer on the walls of each of the select gates;

removing portions of the polysilicon spacers between the second and third select gates;

forming a drain in the silicon substrate between the second and third select gates;

forming a source in the silicon substrate between the polysilicon spacers of the first and second select gates;

forming a silicon oxide layer on the semiconductor wafer to cover all the select gates and the polysilicon spacers;

performing a dry etching process to remove a predetermined thickness of the silicon oxide layer and to remove the dielectric layer above each of the select gates down to a predetermined thickness;

forming an insulating layer over each of the polysilicon spacers; and forming a control gate over the polysilicon spacers between the first and the second select gates;

wherein each of the polysilicon spacers between the first and second select gates acts as a floating gates of the spilt-gate flash memory cell and is used to enhance the coupling ratio of the spilt-gate flash memory cell.

9. The method of claim 8 wherein the method of forming the polysilicon spacer on the wall of each of the select gates comprises the following steps:

forming a second polysilicon layer on the surface of the semiconductor wafer to cover all the select gates; and performing an etch back process to remove the second polysilicon layer down to the surface of the silicon substrate so that the remaining portion of the second polysilicon layer on the wall of each of the select gates forms the polysilicon spacer.

10. The method of claim 8 wherein the method of removing the polysilicon spacers between the second select gate and the third select gate comprises the following steps:

forming a first photo-resist layer to cover the polysilicon spacers between the first select gate and the second select gate; and performing an etching process to remove the polysilicon spacers between the second select gate and the third select gate.

11. The method of claim 10 wherein after removing the polysilicon spacers between the second select gate and the third select gate the source and drain are formed by the following steps:

performing an ion implantation process to form a drain doping region as the drain in the silicon substrate between the second select gate and the third select gate;

removing the first photo-resist layer;

forming a second photo-resist layer on the surface of the semiconductor wafer to expose the surface of the silicon substrate between the first select gate and the second select gate;

performing a self-aligned ion implantation process using the polysilicon spacers between the first select gate and the second select gate as hard masks to form a source doping region as the source on the exposed surface of the silicon substrate; and removing the second photo-resist layer.

12. The method of claim 11 wherein the first photo-resist layer serves as a hard mask during the ion implantation process.

13. The method of claim 8 wherein after forming the first select gate, the second select gate and the third select gate the method further comprises an oxidation process to form a silicon dioxide layer on the exposed surface of the first polysilicon layer.

14. The method of claim 8 wherein the insulating layer is an ONO dielectric layer.

15. The method of claim 8 wherein the control gate is composed of doped polysilicon.

* * * * *